United States Patent
Chung et al.

(10) Patent No.: US 9,543,335 B2
(45) Date of Patent: *Jan. 10, 2017

(54) LIQUID-CRYSTAL DISPLAY AND ELEMENT SUBSTRATE THEREOF

(71) Applicant: INNOLUX CORPORATION, Chu-Nan, Miao-Li County (TW)

(72) Inventors: Yueh-Ting Chung, Chu-Nan (TW); Jyun-Yu Chen, Chu-Nan (TW); Wei-Chen Hsu, Chu-Nan (TW); Yung-Hsin Lu, Chu-Nan (TW); Chao-Hsiang Wang, Chu-Nan (TW); Kuan-Yu Chiu, Chu-Nan (TW)

(73) Assignee: INNOLUX CORPORATION, Jhu-nan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/003,596

(22) Filed: Jan. 21, 2016

(65) Prior Publication Data

US 2016/0139452 A1  May 19, 2016

Related U.S. Application Data

(63) Continuation-in-part of application No. 14/493,173, filed on Sep. 22, 2014, now Pat. No. 9,360,725.

(30) Foreign Application Priority Data

Jul. 17, 2014 (TW) .............................. 103124494 A

(51) Int. Cl.
*H01L 27/12* (2006.01)
*G02F 1/1362* (2006.01)
*G02F 1/1333* (2006.01)

(52) U.S. Cl.
CPC ....... *H01L 27/124* (2013.01); *G02F 1/136227* (2013.01); *H01L 27/1222* (2013.01); *H01L 27/1225* (2013.01); *G02F 2001/133357* (2013.01); *G02F 2201/40* (2013.01)

(58) Field of Classification Search
CPC .... G02F 1/1362; G02F 1/1343; G02F 1/1368; G02F 1/136227; G02F 1/136286; G02F 1/1345; G02F 2001/133357; H01L 27/124; H01L 27/1222; H01L 27/1225
See application file for complete search history.

(56) References Cited

U.S. PATENT DOCUMENTS

| | | | |
|---|---|---|---|
| 6,136,624 | A | 10/2000 | Kemmochi et al. |
| 6,147,722 | A | 11/2000 | Shimada et al. |
| 2003/0209709 | A1 | 11/2003 | Tanabe et al. |
| 2005/0179849 | A1 | 8/2005 | Nomura et al. |
| 2010/0321283 | A1 | 12/2010 | Mizuno et al. |

(Continued)

*Primary Examiner* — Anne Hines
*Assistant Examiner* — Jose M Diaz
(74) *Attorney, Agent, or Firm* — Liu & Liu

(57) ABSTRACT

An element substrate is provided, including a substrate, a metal layer and a planarization layer. The metal layer is located on the substrate. The metal layer has a first edge in a first direction. The planarization layer is located on the metal layer. The planarization layer includes a contact hole. The contact hole has a contiguous wall and a bottom side. The metal layer is exposed in the bottom side. A contour line of the contiguous wall on a vertical plane is a curved line. The first edge corresponds vertically with a critical point on the contour line. The slope of a tangent line on the critical point of the contour line is between 0.087 to 0.364.

20 Claims, 9 Drawing Sheets

(56) References Cited

U.S. PATENT DOCUMENTS

| | | |
|---|---|---|
| 2011/0141425 A1 | 6/2011 | Moriya et al. |
| 2012/0068200 A1 | 3/2012 | Oh et al. |
| 2013/0299830 A1 | 11/2013 | Ishigaki et al. |
| 2015/0116623 A1 | 4/2015 | Tomioka et al. |
| 2015/0124190 A1 | 5/2015 | Komatsu et al. |
| 2015/0138476 A1 | 5/2015 | Hyodo et al. |
| 2015/0268526 A1 | 9/2015 | Kakinuma et al. |

LIQUID-CRYSTAL DISPLAY AND ELEMENT SUBSTRATE THEREOF

CROSS REFERENCE TO RELATED APPLICATIONS

This application is a Continuation-In-Part of pending U.S. patent application Ser. No. 14/493,173, filed Sep. 22, 2014 and entitled "liquid-crystal display and element substrate thereof, which claims priority of Taiwan Patent Application No. 103124494, filed on Jul. 17, 2014, the entirety of which is incorporated by reference herein.

BACKGROUND OF THE INVENTION

Field of the Invention

The present invention relates to a liquid-crystal display, and in particular to a liquid-crystal display having at least one contact hole.

Description of the Related Art

In a liquid-crystal display, a contact hole is utilized to conduct a pixel electrode and a source electrode. However, with reference to FIG. 1, the liquid-crystal molecules 2 are arranged along a profile of the contact hole 1. The contact hole 1 is like a funnel structure, and light leakage in dark state happens due to the liquid-crystal molecules 2 arranged along the profile of the contact hole 1, and the contrast ratio of the liquid-crystal display is decreased.

With reference to FIG. 1, conventionally, an area of the source electrode 3 at the bottom the contact hole 1 is increased to cover the light-leaking liquid-crystal molecules 2, and to improve the contrast ratio of the liquid-crystal display. However, this method decreases the aperture ratio and the transmittance in bright state of the liquid-crystal display, and an improved solution is required.

BRIEF SUMMARY OF THE INVENTION

In one embodiment of the invention, an element substrate is provided, which includes a substrate, a metal layer and a planarization layer. The metal layer is disposed on the substrate, wherein the metal layer has a first width along a first direction. The planarization layer is disposed on the metal layer and having a first thickness along a second direction perpendicular to the first direction, wherein the planarization layer comprises a top and a bottom, and the first thickness is a distance between the top and the bottom along the second direction in a pixel region. The planarization layer comprises a contact hole, the contact hole has a contiguous wall and a hole bottom, the hole bottom exposes the metal layer, and the hole bottom of the contact hole has a second width along the first direction, wherein the first width and the second width satisfy the following equation:

$$2*\left\{\frac{L_2}{2} + \frac{(1-p)h}{\ln(p)\cdot\tan(1.5\theta)} \cdot \ln\left[\frac{-\tan\delta*(1-p)}{\ln(p)\cdot\tan(1.5\theta)}\right]\right\} - 3.8 \leq$$
$$L_1 \leq 2*\left\{\frac{L_2}{2} + \frac{(1-p)h}{\ln(p)\cdot\tan(1.5\theta)} \cdot \ln\left[\frac{-\tan\delta*(1-p)}{\ln(p)\cdot\tan(1.5\theta)}\right]\right\} + 3.8$$

wherein $L_1$ is the first width, and $L_2$ is the second width, h is the first thickness, $\delta$ is an angle between 5 degrees to 20 degrees, $\theta$ is an included angle between a straight line and an extension surface of the hole bottom, and the straight line connects a reference point and a base point, and the reference point and the base point are located on the contiguous wall, wherein a distance from the reference point to the bottom of the planarization layer along the second direction is 0.95 h. The base point is located at the point where the contiguous wall is connected to the hole bottom, p is an adjustable parameter, and $0 < p \leq 0.1$.

Utilizing the embodiment of the invention, the aperture ratio and the contrast ratio of the liquid-crystal display are optimized.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
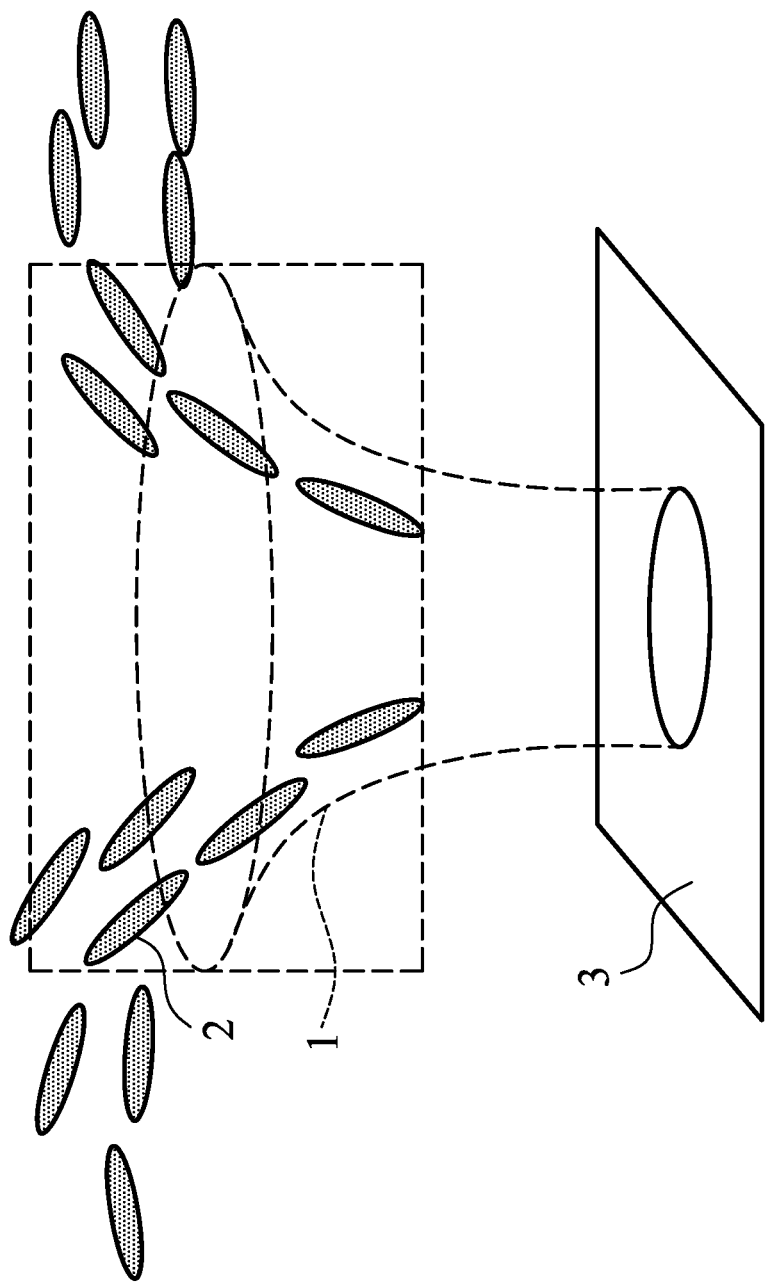
FIG. 1 shows an element substrate of a conventional liquid-crystal display.
Figure 2A:
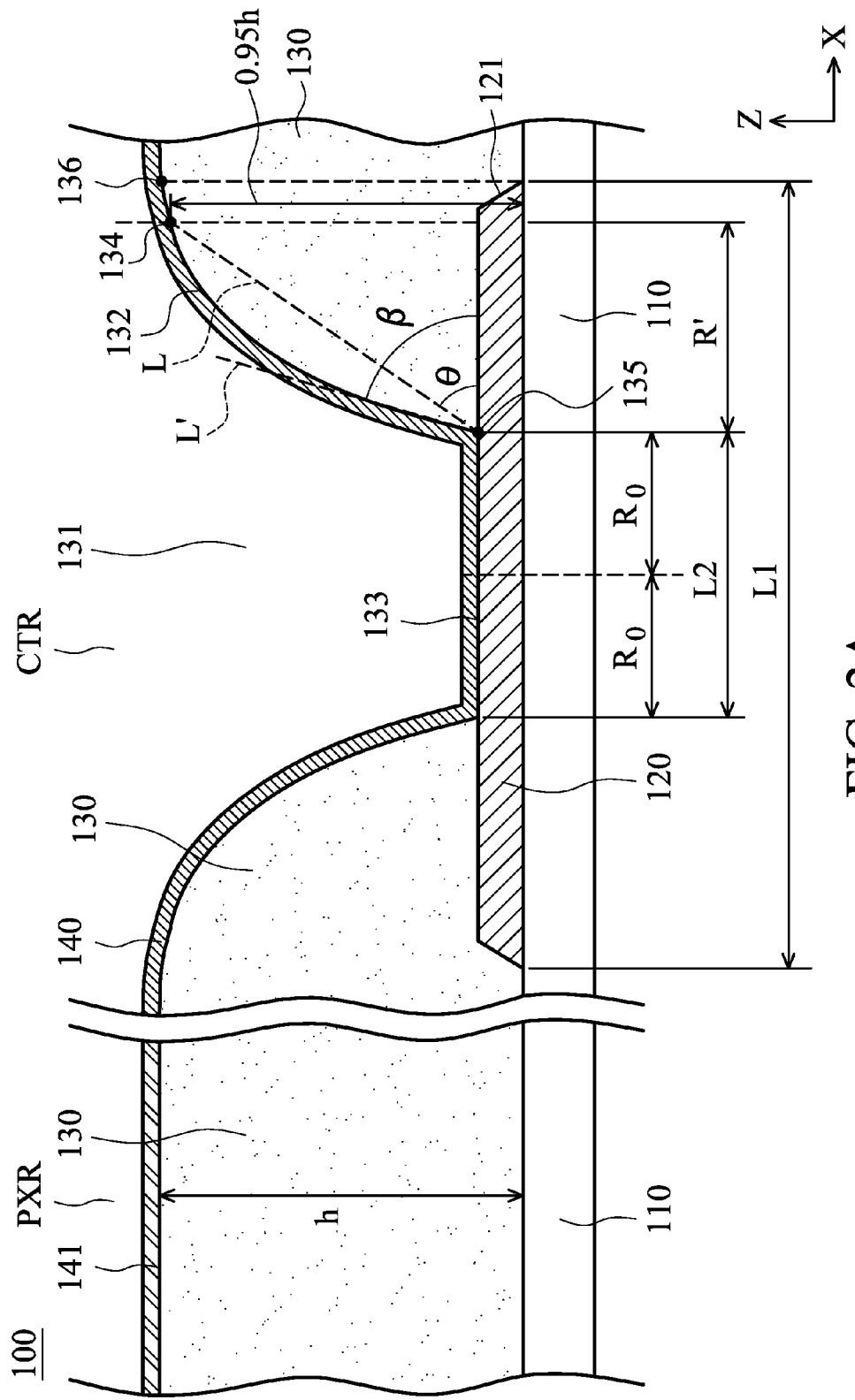
FIG. 2A shows cross-section structure of an element substrate of one embodiment of the invention.

FIG. 2A shows an element substrate 100 of an embodiment of the invention, which comprises a substrate 110, a metal layer 120 and a planarization layer 130. The metal layer 120 is disposed on the substrate 110, wherein the metal layer 120 has a first width L1 along a first direction X. The extending direction of scan lines of the element substrate 100 is parallel to the first direction X. The planarization layer 130 is disposed on the metal layer 120 and has a first thickness h along a second direction Z, the second direction Z is perpendicular to the first direction X, and the second direction Z represent as a normal vector (vertical) of the element substrate 100. The planarization layer 130 comprises a top and a bottom, and the first thickness h is a distance between the top and the bottom along the second direction Z in a pixel region (PXR), the pixel region locates adjacent to a contact region (CTR) where the contact hole 131 is formed. The planarization layer 130 comprises a contact hole 131, the contact hole 131 is formed through the planarization layer 130, the contact hole 131 has a contiguous wall 132 and a hole bottom 133, the hole bottom 133 exposes the metal layer 120, and the hole bottom 133 of the contact hole 131 has a second width L2 along the first direction X.

The applicant has discovered that the liquid-crystal molecules are arranged along the contiguous wall 132, and the light transmittance is changed with the slope of the contiguous wall 132. At the location where the tangent slope of the contiguous wall 132 is about tan 10°, light leakage in dark state is acceptable, and the contrast ratio of the liquid-crystal display is qualified. When the edge of the metal layer 120 extends to the critical point 136 (where the tangent slope of the contiguous wall 132 is about tan 10°, the aperture ratio (transmittance) and the contrast ratio are optimized.

With reference to FIG. 2A, the applicant has discovered from deriving curve equations that when the first width and the second width satisfy the following equation, the aperture ratio and the contrast ratio are optimized:

$$2*\left\{\frac{L_2}{2} + \frac{0.95h}{\ln(0.5)\cdot\tan(1.5\theta)} \cdot \ln\left[\frac{-\tan\delta \cdot 0.95}{\ln(0.05)\cdot\tan(1.5\theta)}\right]\right\} - 3.8 \le$$

$$L_1 \le 2*\left\{\frac{L_2}{2} + \frac{0.95h}{\ln(0.05)\cdot\tan(1.5\theta)} \cdot \ln\left[\frac{-\tan\delta \cdot 0.95}{\ln(0.05)\cdot\tan(1.5\theta)}\right]\right\} + 3.8$$

wherein $L_1$ is the first width of the metal layer 120 along the first direction X, and $L_2$ is the second width of the hole bottom 133 of the contact hole 131 along the first direction X, h is a first thickness (the first thickness is a distance between the top of the planarization layer 130 and the bottom of the planarization layer 130 along the second direction Z in a pixel region), $\delta$ is an angle between 5 degrees to 20 degrees, $\theta$ is an included angle between a straight line L and an extension surface of the hole bottom 133. The straight line L connects a reference point 134 and a base point 135, the reference point 134 and the base point 135 are located on the contiguous wall 132, wherein a distance from the reference point 134 to bottom of the planarization layer along the second direction is 0.95h. The base point 135 is located at the point where the contiguous wall 132 is connected to the hole bottom 133, and ±3.8 is the tolerance. By modifying the parameters above, the curvature and the shape of the contiguous wall 132 can be modified.

The tangent slope of a particular point on a top curvature of the polarization layer 130 is tanδ, and the angle δ is an included angle (acute angle) between a tangent line of the particular point and a horizontal line passes through the particular point (the horizontal line is perpendicular to the second direction Z). The angle δ of particular point corresponding to the pixel region (PXR) is between 0 to 2 degrees. The angle δ of particular point corresponding to the contact region (CTR) is between 2 degrees to 90 degrees. The critical point 136 is one of a set formed by a plurality of particular points of the contact region. In the embodiment above, in the contact region, the angle δ is an angle between 5 degrees to 20 degrees to make optimization between the aperture ratio (transmittance) and contrast ratio of the liquid crystal display. In one embodiment, to achieve an improved aperture ratio (transmittance), the angle δ is smaller than 10 degrees, and the angle δ is greater than or equal to 5 degrees (5 degrees≤δ<10 degrees). In another one embodiment, to achieve an improved contrast ratio (low light leakage in dark state), the angle δ is greater than 10 degrees, and the angle δ is smaller than or equal to 20 degrees (10 degrees<δ≤20 degrees).

With reference to FIG. 2A, the derivative of the curve equation is presented in the following description.

First, curve fitting (assuming), assuming a curve equation of the contiguous wall of the contact hole is:

$$y = f(x) = -A'\exp(-x) \quad (1)$$

In equation (1), only asymptotes of the contiguous wall are defined, and the equation (1) must be regulated relative to the first direction X (X axis) and a third direction Y (Y axis), wherein the first direction X, the second direction Z, and the third direction Y are perpendicular to each other.

Next, the curve fitting (relative to reference point 134, base point 135 and included angle θ), assuming that a distance between the reference point 134 and the top of the planarization layer 130 is p times of the thickness h of the planarization layer 130, and satisfies equation f(R'), and the horizontal distance between the reference point 134 and the base point 135 is R', then:

$$f(R') = -ph = -h\exp\left(\frac{-R'}{\alpha}\right) \quad (1)$$

$$\Rightarrow \alpha = \frac{-R'}{\ln(p)};$$

$$p > 0, h > 0, R' > 0 \quad (2)$$

Correction parameter α is achieved.

Next, a straight line L connects the reference point 134 and the base point 135, and an included angle between a straight line and the horizontal line is θ, then:

$$\tan\theta = \frac{(1-p)h}{R'} \quad (3)$$

$$\Rightarrow R' = \frac{(1-p)h}{\tan\theta}$$

Material property θ is brought in.

Next, a distance between the reference point and the bottom of the planarization layer along the second direction Z is 0.95h. By combining equations of equation (2) and equation (3), we get:

$$\alpha = \frac{-R'}{\ln(0.05)} = \frac{-0.95h}{\ln(0.05)\cdot\tan\theta} \quad (4)$$

Correction parameter α is achieved.

Next, the included angle β between a cut line L' at base point 135 and the horizontal line defines the angle of the curve of the planarization layer 130, and included angle β is about 1.5θ. Therefore, by revising the curve equation (angle revising) further, we get:

$$f(R') = -h\cdot\exp\{-R'/\alpha\} = -h\cdot\exp\left\{R'\cdot\frac{\ln(0.05)\cdot\tan\beta}{0.95h}\right\} \quad (5)$$

$$= -h\cdot\exp\left\{R'\cdot\frac{\ln(0.05)\cdot\tan(1.5\theta)}{0.95h}\right\}$$

Curve equation of the contact hole is achieved.

Next, $R=R_0+R'$, by bringing this equation into the above equation, we get:

$$\because R' = R - R_0 \ldots \text{(shiftting)} \quad (6)$$

-continued $$\Rightarrow f(R') = -h \cdot \exp\{-(R-R_0)/\alpha\}$$
$$= -h \cdot \exp\left\{(R-R_0) \cdot \frac{\ln(0.05) \cdot \tan(1.5\theta)}{0.95h}\right\}$$

Actual curve equation of the contact hole is achieved.

Next, as mentioned above, at the location where the tangent slope of the particular point of the contiguous wall 132 is tan δ, the light leakage is acceptable, and the contrast ratio of the liquid-crystal display is qualified, and the aperture ratio and the contrast ratio are optimized. The equation of half of the second width of the metal layer along the first direction is:

$$\frac{\partial f(R')}{\partial R'} = \tan\delta = \frac{\partial}{\partial R'}\left\{-h \cdot \exp\left[R' \cdot \frac{\ln(0.05) \cdot \tan(1.5\theta)}{0.95h}\right]\right\} \quad (7)$$

$$\Rightarrow -h \cdot \exp\left[R' \cdot \frac{\ln(0.05) \cdot \tan(1.5\theta)}{0.95h}\right] \cdot \frac{\partial}{\partial R'}\left[R' \cdot \frac{\ln(0.05) \cdot \tan(1.5\theta)}{0.95h}\right] = \tan\delta$$

$$\Rightarrow \exp\left[R' \cdot \frac{\ln(0.05) \cdot \tan(1.5\theta)}{0.95h}\right] = \frac{-\tan\delta \cdot 0.95}{\ln(0.05) \cdot \tan(1.5\theta)}$$

$$\Rightarrow R' \cdot \frac{\ln(0.05) \cdot \tan(1.5\theta)}{0.95h} = \ln\left[\frac{-\tan\delta \cdot 0.95}{\ln(0.05) \cdot \tan(1.5\theta)}\right]$$

$$\Rightarrow R' \cdot \frac{0.95h}{\ln(0.05) \cdot \tan(1.5\theta)} \cdot \ln\left[\frac{-\tan\delta \cdot 0.95}{\ln(0.05) \cdot \tan(1.5\theta)}\right]$$

$$\Rightarrow R = R_0 + \frac{0.95h}{\ln(0.05) \cdot \tan(1.5\theta)} \cdot \ln\left[\frac{-\tan\delta \cdot 0.95}{\ln(0.05) \cdot \tan(1.5\theta)}\right]$$

Considering that ±3.8 is acceptable manufacturing tolerance, when the first width and the second width satisfy the following equation, the aperture ratio and the contrast ratio are optimized:

$$2 * \left\{\frac{L_2}{2} + \frac{0.95h}{\ln(0.5) \cdot \tan(1.5\theta)} \cdot \ln\left[\frac{-\tan\delta \cdot 0.95}{\ln(0.05) \cdot \tan(1.5\theta)}\right]\right\} - 3.8 \leq$$

$$L_1 \leq 2 * \left\{\frac{L_2}{2} + \frac{0.95h}{\ln(0.05) \cdot \tan(1.5\theta)} \cdot \ln\left[\frac{-\tan\delta \cdot 0.95}{\ln(0.05) \cdot \tan(1.5\theta)}\right]\right\} + 3.8$$

In one embodiment, to achieve aperture ratio and contrast ratio balanced, the angle δ could be equal to 10 degrees. In another one embodiment, to achieve an improved aperture ratio (transmittance), the angle δ is smaller than 10 degrees, and the angle δ is greater than or equal to 5 degrees (5 degrees≤δ<10 degrees). In another one embodiment, to achieve an improved contrast ratio (low light leakage in dark state), the angle δ is greater than 10 degrees, and the angle δ is smaller than or equal to 20 degrees (10 degrees<δ≤20 degrees)

With reference to FIG. 2A, the element substrate 100 further comprises a first conductive layer 140 disposed on the planarization layer 130 in the contact region, wherein the first conductive layer 140 is electrically connected to the metal layer 120 via the contact hole 131. The first conductive layer 140 is made of transparent material or metal. In one embodiment, a second conductive layer 141 is disposed on the planarization layer 130 in the pixel region. The second conductive layer 141 can be the same with or different from the first conductive layer 140.

Figure 2B:
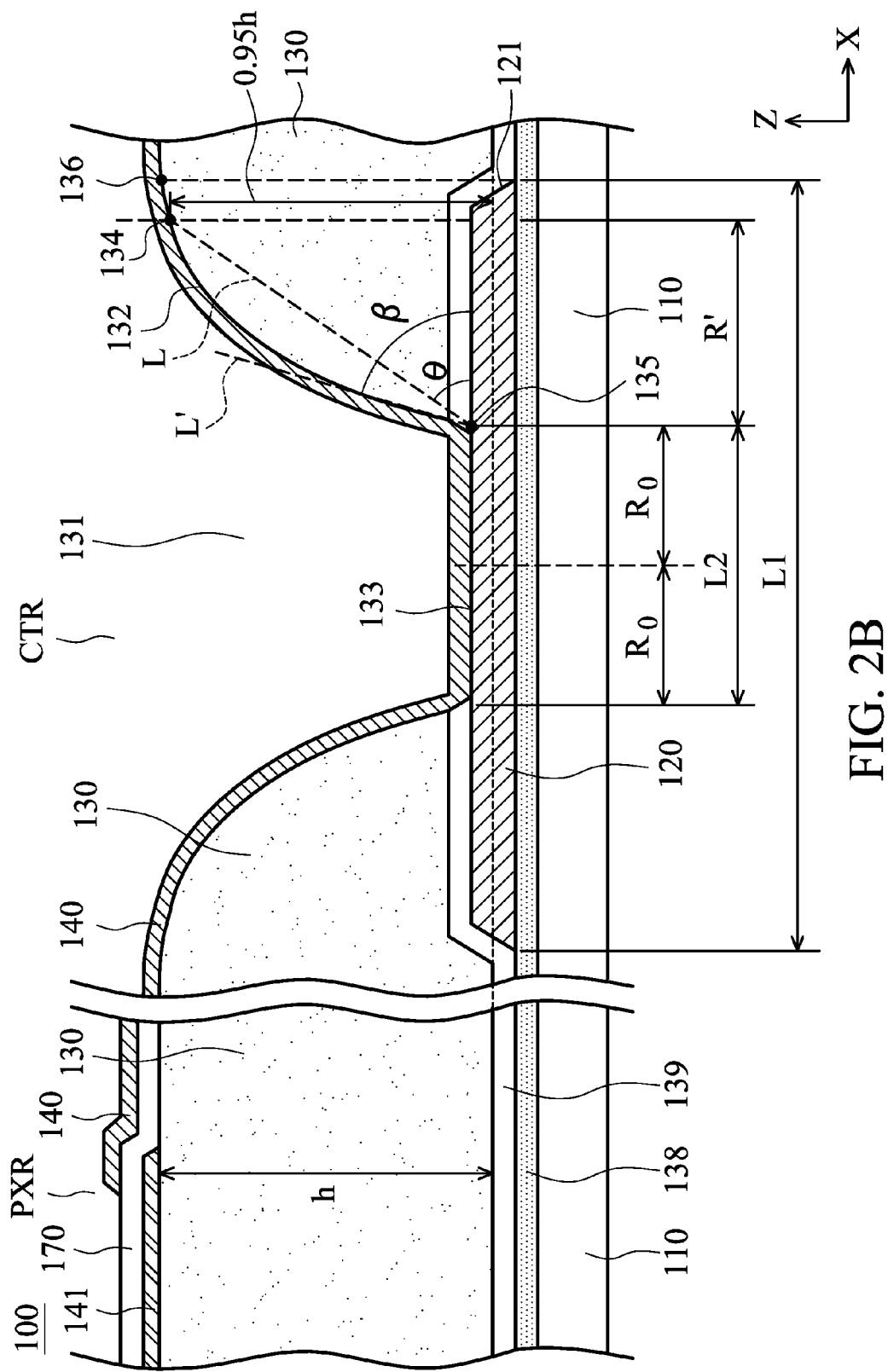
FIG. 2B shows cross-section structure of an element substrate of another one embodiment of the invention.
Figure 2C:
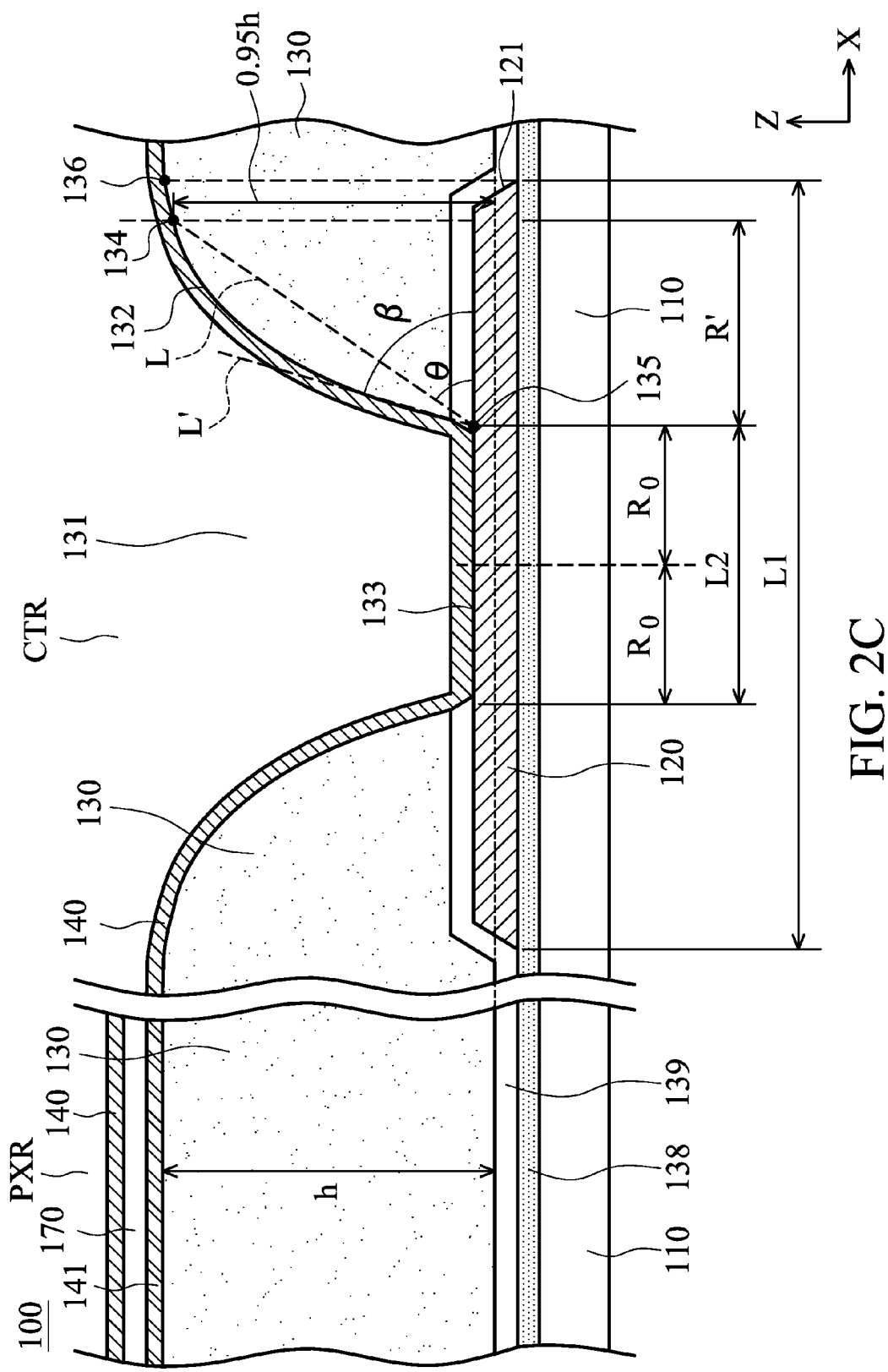
FIG. 2C shows cross-section structure of an element substrate of another one embodiment of the invention.

FIG. 2B shows another element substrate of an embodiment of the invention. With reference to FIG. 2B, the metal layer 120 is a source electrode or a drain electrode of a driving element (TFT). The metal layer can contact with a semiconductor layer made of polycrystalline silicon, non-crystalline silicon or metal oxide. In one embodiment, the element substrate 100 further comprises a first insulation layer 138, a second insulation layer 139 and a third insulation layer 170. The first insulation layer 138 is located between the metal layer 120 and the substrate 110. The first insulation layer 138 can be made of silicon oxide, silicon nitride, alumina nitride, or other transparent materials. The second insulation layer 139 is located between the metal layer 120 and the planarization layer 130, wherein the contact hole 131 passing through the planarization layer 130 and the second insulation layer 139 to expose the metal layer 120. The material of second insulation layer 139 could be the same with the first insulation layer 138. The third insulation layer 170 is located between the first conductive layer 140 and the planarization layer 130. The material of third insulation layer 170 could be the same with the first insulation layer 138. FIG. 2C shows another element substrate of an embodiment of the invention, wherein the third insulation layer 170 is located between the second conductive layer 141 and the planarization layer 130.

Figure 3A:
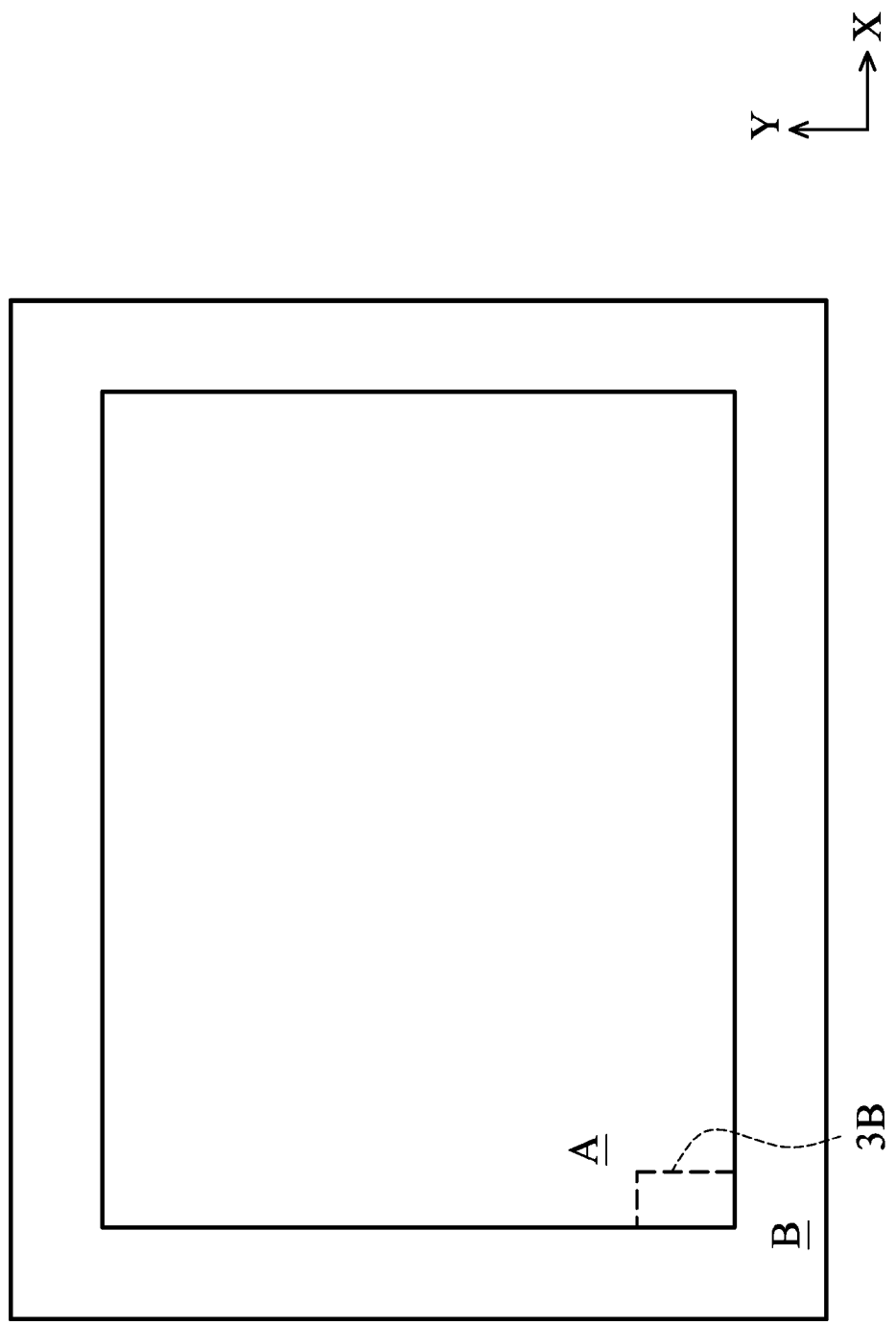
FIG. 3A shows top-view of the element substrate of the embodiment of the invention utilized in a liquid-crystal display.
Figure 3B:
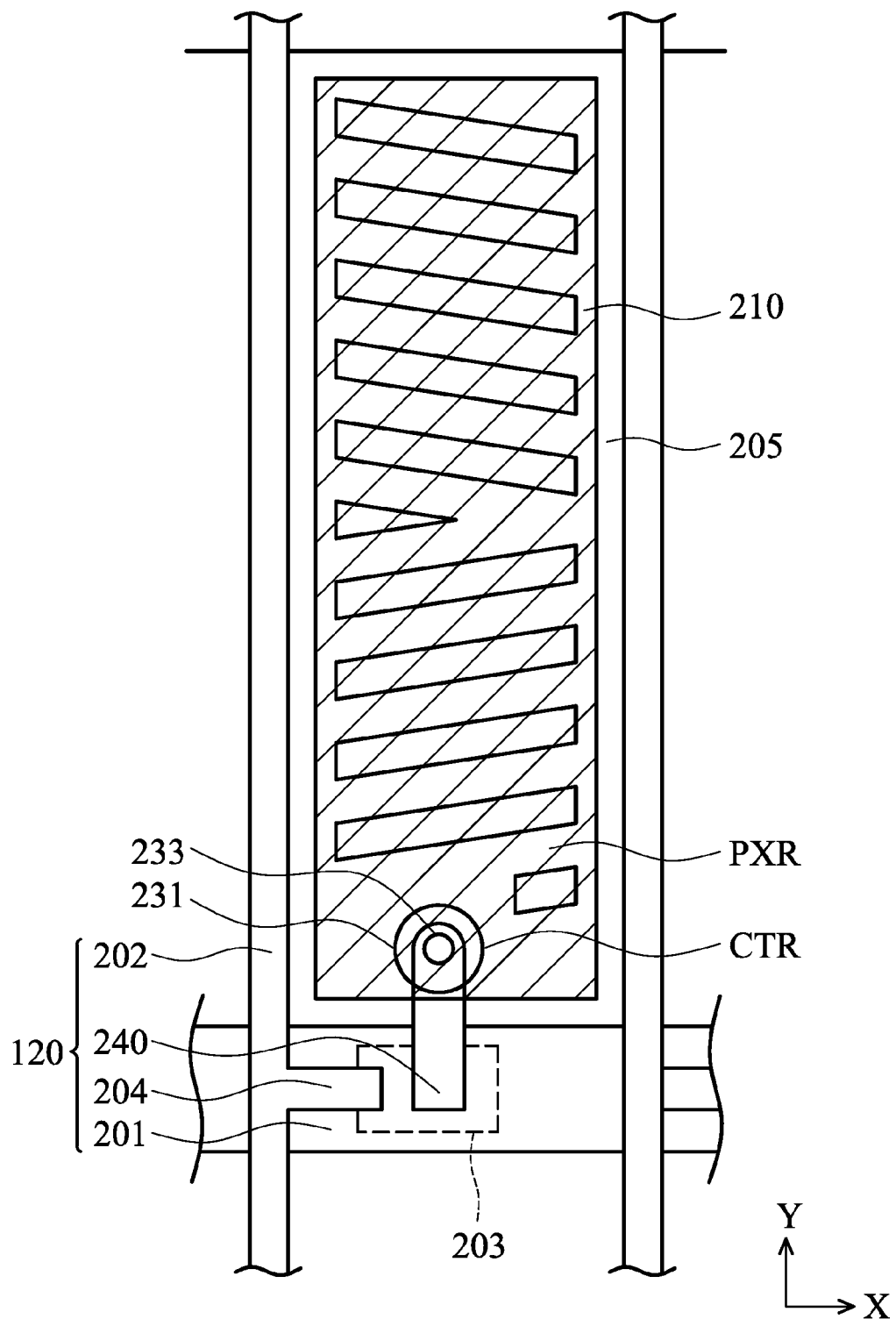
FIG. 3B shows top-view of the structure of portion 3B of FIG. 3A in detail.
Figure 3C:
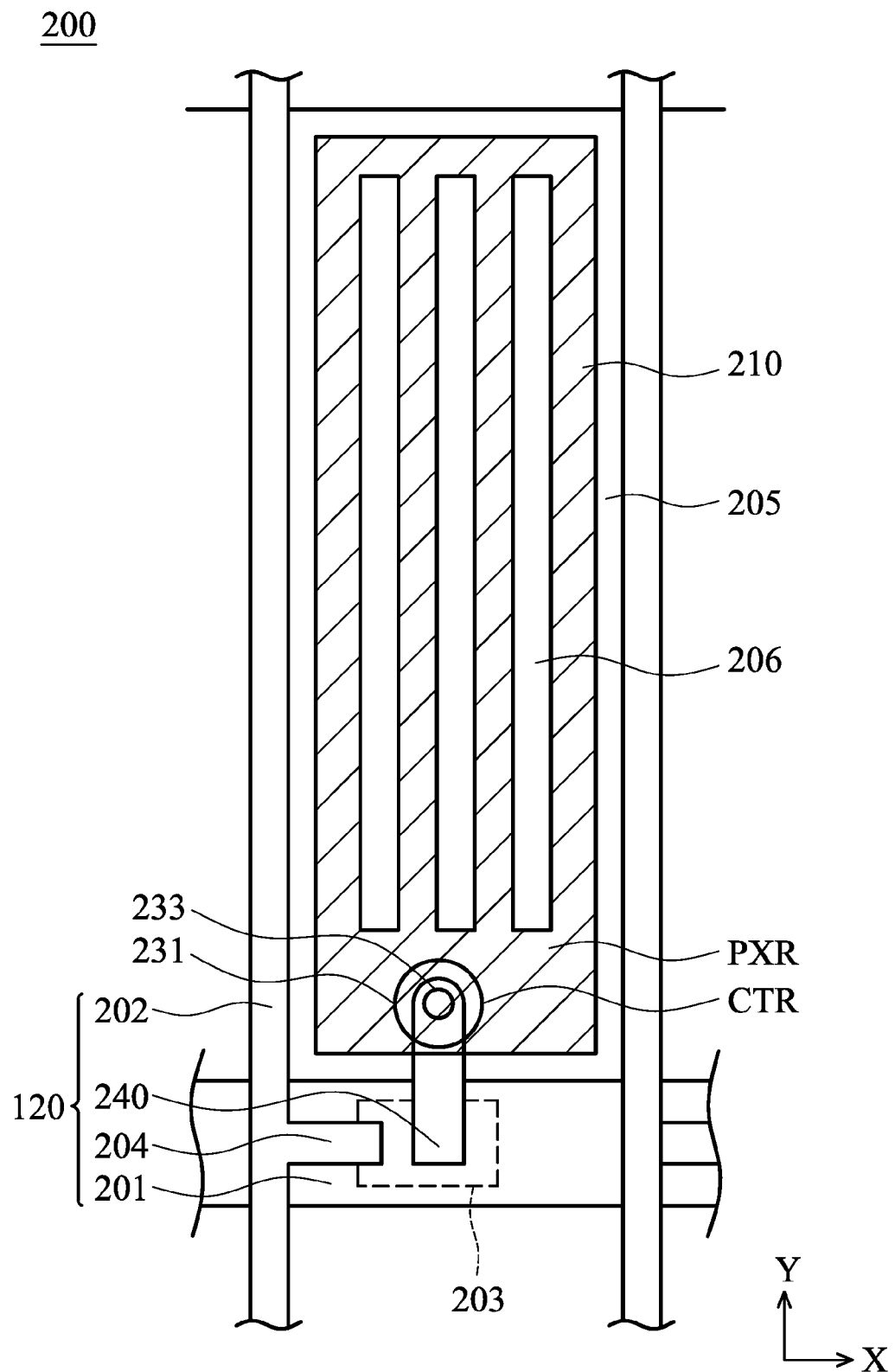
FIG. 3C shows top-view of the detailed structures of another one embodiment.

FIG. 3A shows the element substrate of the embodiment of the invention utilized in a liquid-crystal display 200, which comprises an active area A and an peripheral area (B). FIG. 3B shows detailed structures of portion 3B is FIG. 3A, wherein the liquid-crystal display 200 further comprises scan lines 201 (along the first direction X), data lines 202 (along the third direction Y), a semiconductor layer 203, source electrodes 240, a contact hole 231, a hole bottom 233 of the contact hole, drain electrodes 204, common electrodes 205 and pixel electrodes 210, which are located in the active area A. In an embodiment of the invention, the metal layer 120 could be the source electrodes 240, the drain electrodes 204, the scan lines 201 or the signal lines 202. The contact hole 231 defines a contact region, and the pixel region is adjacent to the contact region. FIG. 3C shows the detailed structures of another one embodiment, wherein slits 206 of the pixel electrodes 210 extends along the third direction Y.

With reference to FIG. 2A, in another one embodiment, the metal 120 comprises a first edge 121, the first edge 121 vertically corresponds to a critical point 136 which is on the contiguous wall 132, and the tangent slope of the contiguous wall 132 at the critical point 136 is tan δ (5 degrees≤δ≤20 degrees). The base point 135 is located at the point where the contiguous wall 132 is connected to the hole bottom 133. The straight line L connects a reference point 134 and a base point 135. An included angle θ is between a straight line L and a horizontal line. The metal layer 120 has a first width L1 along the first direction X, and the hole bottom 133 of the contact hole 131 has a second width L2 along the first direction X, wherein the first width and the second width satisfy the following equation:

$$2 * \left\{\frac{L_2}{2} + \frac{(1-p)h}{\ln(p) \cdot \tan(1.5\theta)} \cdot \ln\left[\frac{-\tan\delta * (1-p)}{\ln(p) \cdot \tan(1.5\theta)}\right]\right\} = L_1$$

L1 is the first width of the metal layer 120 along the first direction X, and L2 is the second width of the hole bottom 133 of the contact hole 131 along the first direction X, and p is an adjustable parameter, and 0<p≤0.1. By modifying the parameters above, the curvature and the shape of the contiguous wall 132 can be modified.

Figure 4:
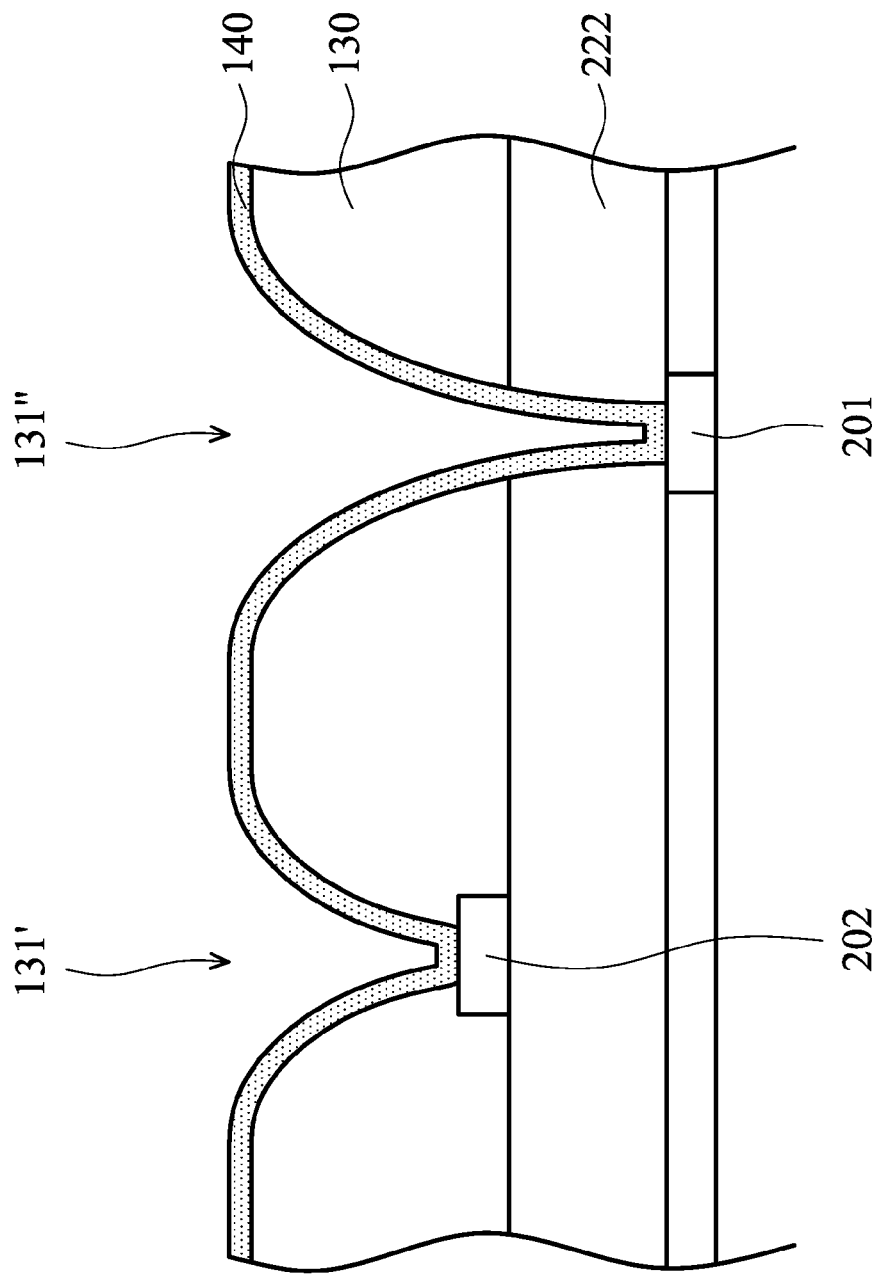
FIG. 4 shows cross-section structure of the element substrate of another one embodiment of the invention.

In the embodiments above, the contact hole is in the active area A. However, the invention is not limited thereby. The contact hole structure of the embodiment of the invention can also be located in peripheral area B. With reference to FIG. 4, in one embodiment, the first conductive layer 140 is connected to the data line 202 via the contact hole 131' of the planarization layer 130, and the relationship between the profile of the contact hole 131' and the width of the data line 202 can satisfy the above equations. The first conductive layer 140 is connected to the scan line 201 via the contact hole 131" of the planarization layer 130 and the gate insulation layer 222. The relationship between the profile of the contact hole 131" and the width of the scan line 201 can satisfy the above equations. In this embodiment, the gate insulation layer 222 is formed between the data line 202 and the scan line 201.

Figure 5:
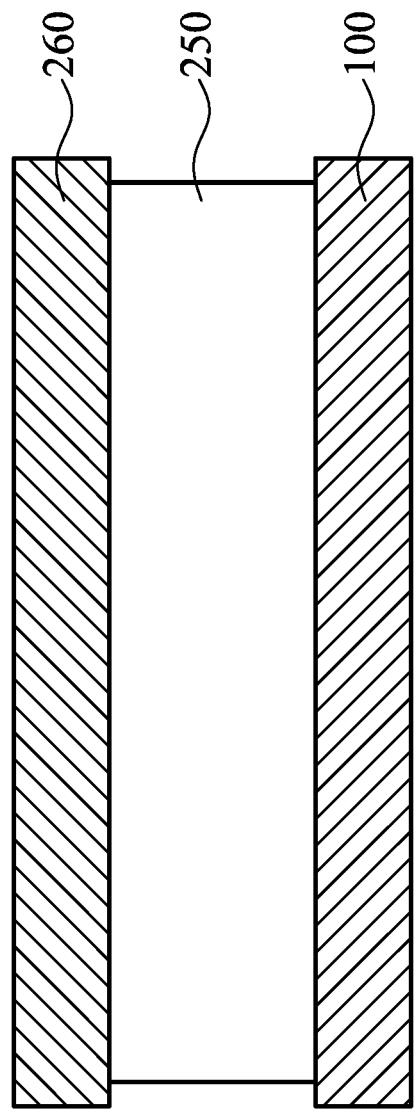
FIG. 5 shows cross-section structure of a liquid-crystal display of one embodiment of the invention.

FIG. 5 shows a liquid-crystal display 200 of an embodiment of the invention, which comprises an opposite substrate 260, a liquid-crystal layer 250, a sealant structure and the element substrate 100. The liquid-crystal layer 250 is disposed between the element substrate 100 and the opposite substrate 260 and surrounded by the sealant structure. The opposite substrate 260 may comprises color filter layer. The element substrate 100 could be connected with drivers or printed circuit board.

With reference to Table 1, in the embodiment of the invention, the width of the metal layer (M2) 120 has tolerance of ±3.8.

TABLE 1

|  | Sample 1 | Sample 2 | Sample 3 | Sample 4 | Sample 5 | Sample 6 | Sample 7 |
| --- | --- | --- | --- | --- | --- | --- | --- |
| Designed width of the metal layer (M2) | 14.54 | 6.42 | 8.69 | 8.12 | 12.07 | 23.56 | 31.37 |
| Actual width of the metal layer (M2) 120 | 15.37 | 7.66 | 7.41 | 7.79 | 11.52 | 19.84 | 34.93 |
| tolerance | 0.83 | 1.24 | −1.28 | −0.33 | −0.55 | −3.72 | −3.56 |

Utilizing the embodiment of the invention, the aperture ratio and the contrast ratio of the liquid-crystal display are optimized, and the light leakage and the low-contrast ratio problem are prevented.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An element substrate, comprising:
   a substrate;
   a metal layer, disposed on the substrate and having a first width along a first direction; and
   a planarization layer, disposed on the metal layer and having a first thickness along a second direction perpendicular to the first direction,
   wherein the planarization layer comprises a top and a bottom, and the first thickness is a distance between the top and the bottom along the second direction in a pixel region,
   wherein the planarization layer comprises a contact hole, the contact hole has a contiguous wall and a hole bottom, the hole bottom exposes the metal layer, and the hole bottom has a second width along the first direction,
   wherein the first width and the second width satisfy the following equation:

$$2*\left\{\frac{L_2}{2} + \frac{(1-p)h}{\ln(p)\cdot\tan(1.5\theta)}\cdot\ln\left[\frac{-\tan\delta*(1-p)}{\ln(p)\cdot\tan(1.5\theta)}\right]\right\} - 3.8 \le$$

$$L_1 \le 2*\left\{\frac{L_2}{2} + \frac{(1-p)h}{\ln(p)\cdot\tan(1.5\theta)}\cdot\ln\left[\frac{-\tan\delta*(1-p)}{\ln(p)\cdot\tan(1.5\theta)}\right]\right\} + 3.8$$

wherein L1 is the first width, L2 is the second width, h is the first thickness, δ is an angle between 5 degrees to 20 degrees, θ is an included angle between a straight line and an extension surface of the hole bottom, the straight line connects a reference point and a base point, the reference point and the base point are located on the contiguous wall, wherein a distance from the reference point to the bottom of the planarization layer along the second direction is 0.95h, the base point is located at the point where the contiguous wall is connected to the hole bottom, p is an adjustable parameter, and 0<p≤0.1.

2. The element substrate as claimed in claim 1, wherein the adjustable parameter p is 0.05.

3. The element substrate as claimed in claim 1, wherein the angle δ is smaller than 10 degrees, and the angle δ is greater than or equal to 5 degrees.

4. The element substrate as claimed in claim 1, wherein the angle δ is greater than 10 degrees, and the angle δ is smaller than or equal to 20 degrees.

5. The element substrate as claimed in claim 1, further comprising a conductive layer disposed on the planarization layer, wherein the conductive layer is electrically connected to the metal layer via the contact hole.

6. The element substrate as claimed in claim 1, wherein the metal layer is a source electrode or a drain electrode of a driving element.

7. The element substrate as claimed in claim 1, wherein the metal layer is a data line or a scan line of a driving element.

8. The element substrate as claimed in claim 5, wherein the conductive layer is a made of transparent material.

9. The element substrate as claimed in claim 1, further comprising a first insulation layer located between the metal layer and the substrate.

10. The element substrate as claimed in claim 1, further comprising a second insulation layer located between the metal layer and the planarization layer, wherein the contact hole passing through the second insulation layer.

11. The element substrate as claimed in claim 5, further comprising a third insulation layer located between the conductive layer and the planarization layer.

12. A liquid-crystal display, comprising:
   an first substrate;
   an second substrate adjacent to the first substrate;
   a liquid-crystal layer disposed between the first substrate and the second substrate, wherein the first substrate comprises:
      a metal layer, disposed on the substrate and having a first width along a first direction; and
      a planarization layer, disposed on the metal layer and having a first thickness along a second direction perpendicular to the first direction,
      wherein the planarization layer comprises a top and a bottom, and the first thickness is a distance between the top and the bottom along the second direction in a pixel region,
      wherein the planarization layer comprises a contact hole, the contact hole has a contiguous wall and a hole bottom, the hole bottom exposes the metal layer, and the hole bottom has a second width along the first direction,
      wherein the first width and the second width satisfy the following equation:

$$2 * \left\{ \frac{L_2}{2} + \frac{(1-p)h}{\ln(p) \cdot \tan(1.5\theta)} \cdot \ln\left[\frac{-\tan\delta * (1-p)}{\ln(p) \cdot \tan(1.5\theta)}\right] \right\} - 3.8 \le$$

-continued $$L_1 \le 2 * \left\{ \frac{L_2}{2} + \frac{(1-p)h}{\ln(p) \cdot \tan(1.5\theta)} \cdot \ln\left[\frac{-\tan\delta * (1-p)}{\ln(p) \cdot \tan(1.5\theta)}\right] \right\} + 3.8$$

wherein L1 is the first width, L2 is the second width, h is the first thickness, $\delta$ is an angle between 5 degrees to 20 degrees, $\theta$ is an included angle between a straight line and an extension surface of the hole bottom, the straight line connects a reference point and a base point, the reference point and the base point are located on the contiguous wall, wherein a distance from the reference point to the bottom of the planarization layer along the second direction is 0.95h, the base point is located at the point where the contiguous wall is connected to the hole bottom, p is an adjustable parameter, and $0 < p \le 0.1$.

13. The liquid-crystal display as claimed in claim 12, wherein the adjustable parameter p is 0.05.

14. The liquid-crystal display as claimed in claim 12, wherein the angle $\delta$ is smaller than 10 degrees, and the angle $\delta$ is greater than or equal to 5 degrees.

15. The liquid-crystal display as claimed in claim 12, wherein the angle greater than 10 degrees, and the angle $\delta$ is smaller than or equal to 20 degrees.

16. The liquid-crystal display as claimed in claim 12, further comprising a conductive layer disposed on the planarization layer, wherein the conductive layer is electrically connected to the metal layer via the contact hole.

17. The liquid-crystal display as claimed in claim 12, further comprising a first insulation layer located between the metal layer and the substrate.

18. The liquid-crystal display as claimed in claim 12, further comprising a second insulation layer located between the metal layer and the planarization layer, wherein the contact hole passing through the second insulation layer.

19. The liquid-crystal display as claimed in claim 16, further comprising a third insulation layer located between the conductive layer and the planarization layer.

20. The element substrate as claimed in claim 16, wherein the conductive layer is a made of transparent material.

\* \* \* \* \*